United States Patent
Walker

(10) Patent No.: US 6,778,466 B2
(45) Date of Patent: Aug. 17, 2004

(54) MULTI-PORT MEMORY CELL

(75) Inventor: William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 182 days.

(21) Appl. No.: 10/121,968

(22) Filed: Apr. 11, 2002

(65) Prior Publication Data

US 2003/0198094 A1 Oct. 23, 2003

(51) Int. Cl.$^7$ .............................................. G11C 13/04
(52) U.S. Cl. ............................ 365/235.05; 365/235.05; 365/189.07
(58) Field of Search ................ 265/235.05; 365/189.07, 365/189.04, 230.05, 201, 185.03, 154, 230.06, 189.01

(56) References Cited

U.S. PATENT DOCUMENTS

| | | | |
|---|---|---|---|
| 5,036,491 A | 7/1991 | Yamaguchi | 365/189.07 |
| 5,430,685 A | 7/1995 | Nakada | 365/230.05 |
| 5,477,489 A | 12/1995 | Wiedmann | 365/189.04 |
| 5,502,683 A | 3/1996 | Marchioro | 365/230.05 |
| 5,590,087 A | 12/1996 | Chung et al. | 365/230.05 |
| 5,612,923 A | 3/1997 | Gibson et al. | 365/230.05 |
| 5,646,890 A | 7/1997 | Lee et al. | 365/185.11 |
| 5,687,121 A | 11/1997 | Lee et al. | 365/185.11 |
| 5,699,317 A | 12/1997 | Sartore et al. | 365/230.06 |
| 5,717,638 A | 2/1998 | Kim | 365/189.04 |
| 5,734,613 A | 3/1998 | Gibson | 365/189.04 |
| 5,742,557 A | 4/1998 | Gibbins et al. | 365/230.05 |
| 5,822,252 A | 10/1998 | Lee et al. | 365/185.3 |
| 5,883,852 A | 3/1999 | Ghia et al. | 365/230.05 |
| 5,907,508 A | 5/1999 | Lattimore et al. | 365/189.04 |
| 5,912,850 A | 6/1999 | Wood et al. | 365/201 |
| 5,923,593 A | 7/1999 | Hsu et al. | 365/189.04 |
| 5,923,608 A * | 7/1999 | Payne | 365/230.05 |
| 5,978,307 A | 11/1999 | Proebsting et al. | 365/230.05 |
| 5,982,700 A | 11/1999 | Proebsting | 365/230.05 |
| 5,999,478 A | 12/1999 | Proebsting | 365/230.05 |
| 6,144,609 A | 11/2000 | Lattimore et al. | 365/230.05 |
| 6,151,258 A | 11/2000 | Sample et al. | 365/189.05 |
| 6,233,197 B1 | 5/2001 | Agrawal et al. | 365/230.05 |
| 6,288,969 B1 | 9/2001 | Gibbins et al. | 365/230.05 |

OTHER PUBLICATIONS

Golden et al., "A 500 MHZ, write bypassed, 88–entry, 90 bit register file" Advanced Micro Devices, One AMD Place, Sunnyvale, CA 94088 (4–930813–96–4/99).

W. H. Henkels, et al., A 500 MHZ 32–Word x 64–Bit 8–Port Self–Resetting CMOS Register File and Associated Dynamic–to–Static Latch, 1997, Symposium on VLSI Circuits Digest of Technical Papers.

Richard D. Jolly, "A 9–ns, 1.4–Gigabyte/s, 17–Ported CMOS Register File", IEEE Journal of Solid–State Circuits, vol. 26, No. 10, Oct. 1991.

* cited by examiner

*Primary Examiner*—David Nelms
*Assistant Examiner*—Thinh T Nguyen
(74) *Attorney, Agent, or Firm*—Sheppard Mullin Richter & Hampton LLP

(57) ABSTRACT

An improved multi-port memory cell circuit which has a smaller number of write lines and/or transistors than conventional multi-port memory cells, and hence occupies a smaller area, is provided. The reduced area memory cell circuit includes: word lines associated with each bit line of a set of bit lines; a first word line for selecting a subset of the set of bit lines; a second word line for selecting a bit line of the subset of bit lines; and a memory cell for storing a bit value on the selected bit line.

21 Claims, 8 Drawing Sheets

MULTI-PORT MEMORY CELL

FIELD OF THE INVENTION

The invention relates generally to the field of circuit design, and in particular to an improved multi-port memory cell.

BACKGROUND OF THE INVENTION

In super-scalar, Very Long Instruction Word (VLIW) processors and in network processors, memory cells with multiple write ports are typically required. These multiple write ports are associated with multiple bit lines that allow both writing the same data to many memory cells as well as allowing direct communication paths from the multiple execution units to one memory cell.

Prior art multi-port register memory cells used a single write word line for each differential write bit line or a differential write word line for each single write bit line. Using differential word or bit lines caused a large line count which in turn increased the layout area for the memory cell.

FIG. 1 is an example of another prior art multi-write port memory cell. FIG. 1 was a first step in reducing the layout area over the above differential word or bit line memory cell. For illustration purposes, only the write ports are shown. FIG. 1 shows only one memory cell in an array of memory cells in a multi-port register file. The memory cell has back-to-back inverters 156 and 158, which have nodes 152 and 154. There are six word lines (WLs), i.e., WLA, WLB, WLC, WLD, WLE, and WLF, and six write ports shown by six data bit lines (BLs), i.e., BLA, BLB, BLC, BLD, BLE, and BLF. There is a one-to-one correspondence between a write word line and a write bit line (i.e., a write port). For example, word line WLA has transistor 112 which is a switch to allow a connection of bit line BLA to node 152. Word line WLA also is connected to transistor 114, which is a switch to allow a connection to ground of node 154 through transistor 140, when bit line BLA is '1'. The one-to-one correspondence holds also for WLB and BLB, WLC and BLC, WLD and BLD, WLE and BLE, and WLF and BLF.

An example of the operation of the circuit 110 in FIG. 1 is when word line WLA is '1'. Transistors 112 and 114 are turned on. Subsequently, if bit line BLA is '1', transistor 140 is turned on and pulls node 154 down to ground gnd. The bit line BLA value of '1' goes through transistor 112 to node 152. Back-to-back inverters 156 and 158 will maintain node 152 at '1' and node 154 at '0'. Similarly, for example, when word line WLD is '1', transistors 122 and 124 are turned on. If bit line BLD is '1', then transistor 146 is turned on pulling node 154 to ground gnd. Node 152 has the value of bit line BLD. If bit line BLD is '0' then transistor 146 is off. Node 152 is pulled to '0' and node 154 is pulled to '1' by inverter 156.

A conventional final decoding circuit of the prior art, applicable to FIG. 1, is shown in FIG. 2. This example assumes that addresses for write ports A through F, i.e., word lines WLA to WLF of FIG. 1, have been pre-decoded, such that the final decode consists of a 2-input AND gate, implemented here using a dynamic circuit. For instance the AND gate of port A includes a transistor 214 with address input A0 and a transistor 216 with an address input A1. The signal pc is a precharge signal, usually a clock signal. When pc='0', node 213 is "precharged" to a '1' via transistor 212. An AND gate, i.e., transistor 214 connected in series to transistor 216, is disabled because transistor 218 is turned off. The address A0 and A1 is then read when pc='1'. Transistor 218 is turned on, hence enabling the AND gate, i.e., transistors 214 and 216. Node 213 is pulled to ground when both A0 and A1 are '1', otherwise node 213 remains '1'. When node 213 is '0', WLA is '1' via inverter 270. The other five AND gates having address lines B0, B1 to F0, F1 operate in a similar manner as the AND gate for A0, A1. The outputs of decoder circuit 210 are word lines WLA to WLF which is then input into word lines WLA to WLF of FIG. 1.

While the circuit of FIG. 1 gives a reduced area compared to its predecessors, there is still need for improvement, because there is a continuing demand for more memory in a smaller area. Thus a new circuit is needed which uses less area than the prior art.

SUMMARY OF THE INVENTION

The present invention provides an improved multi-port memory cell circuit which has fewer write lines than conventional multi-port memory cells, and hence occupies a smaller area. In addition, according to the preferred embodiment, there are fewer transistors than FIG. 1. Power consumption may also be reduced.

One embodiment of the present invention comprises a method for reducing an area of a memory cell circuit, where the memory cell includes a first plurality of bit lines and a plurality of word lines associated with each bit line. First, a first word line is used for selecting a second plurality of bit lines from the first plurality of bit lines. Next a second word line is used for selecting a bit line of the second plurality of bit lines. And then, a bit value on the bit line is stored in a memory cell.

An aspect of the present invention includes a reduced area memory cell circuit comprising: a plurality of word lines associated with each bit line of a first plurality of bit lines; a first word line of the plurality of word lines for selecting a second plurality of bit lines from the first plurality of bit lines; a second word line of the plurality of word lines for selecting a bit line of the second plurality of bit lines; and a memory cell for storing a bit value on said bit line.

Another embodiment of the present invention comprises a memory cell circuit comprising: a memory cell for storing data; a first word line and a second word line; a plurality of bit lines; a first switch controlled by the first word line, where the first switch connects a first bit line of said plurality of bit lines to a first node; and a second switch controlled by the second word line, where the second switch connects the first node to the memory cell.

Yet another embodiment of the present invention comprises a system for writing data to a memory cell. The system comprises: a first multiplexer for selecting a first bit line of a plurality of bit lines, when a first word line selects the first bit line; a second multiplexer for selecting a second bit line of the plurality of bit lines, when the first word line selects the second bit line; and a third multiplexer for selecting between an output of the first multiplexer and an output of the second multiplexer based on a second word line, wherein an output of the third multiplexer writes data to the memory cell.

A further embodiment of the present invention comprises a system for providing a plurality of selector signals to a first multiplexer and a second multiplexer, wherein the first multiplexer receives data from a bit line having a bit line address, and wherein the second multiplexer receives data from the first multiplexer and writes the data to a memory cell. The system comprises: a first plurality of decoders for receiving a first plurality of bit line addresses and producing a first plurality of write enable signals; at least one logic gate for combining the first plurality of write enable signals into a first selector signal of the plurality of selector signals, where the first selector signal controls the first multiplexer; a second plurality of decoders for receiving a second plurality of bit line addresses and producing a second plurality of write enable signals; and at least one logic gate for combining a write enable signal of the first plurality of write enable signals and a write enable signal of the second plurality of write enable signals into a second selector signal of the plurality of selector signals, where the second selector signal controls the second multiplexer.

Another aspect of the present invention provides a memory cell circuit having a first plurality of bit lines. The memory cell circuit includes: means for selecting a second plurality of bit lines from the first plurality of bit lines; means for selecting a bit line of the second plurality of bit lines; and means for writing a bit value on the bit line to a memory cell.

These and other embodiments, features, aspects and advantages of the invention will become better understood with regard to the following description, appended claims and accompanying drawings.

DETAILED DESCRIPTION OF THE INVENTION

In the following description, numerous specific details are set forth to provide a more thorough description of the specific embodiments of the invention. It is apparent, however, to one skilled in the art, that the invention may be practiced without all the specific details given below. In other instances, well known features have not been described in detail so as not to obscure the invention.

Figure 1:
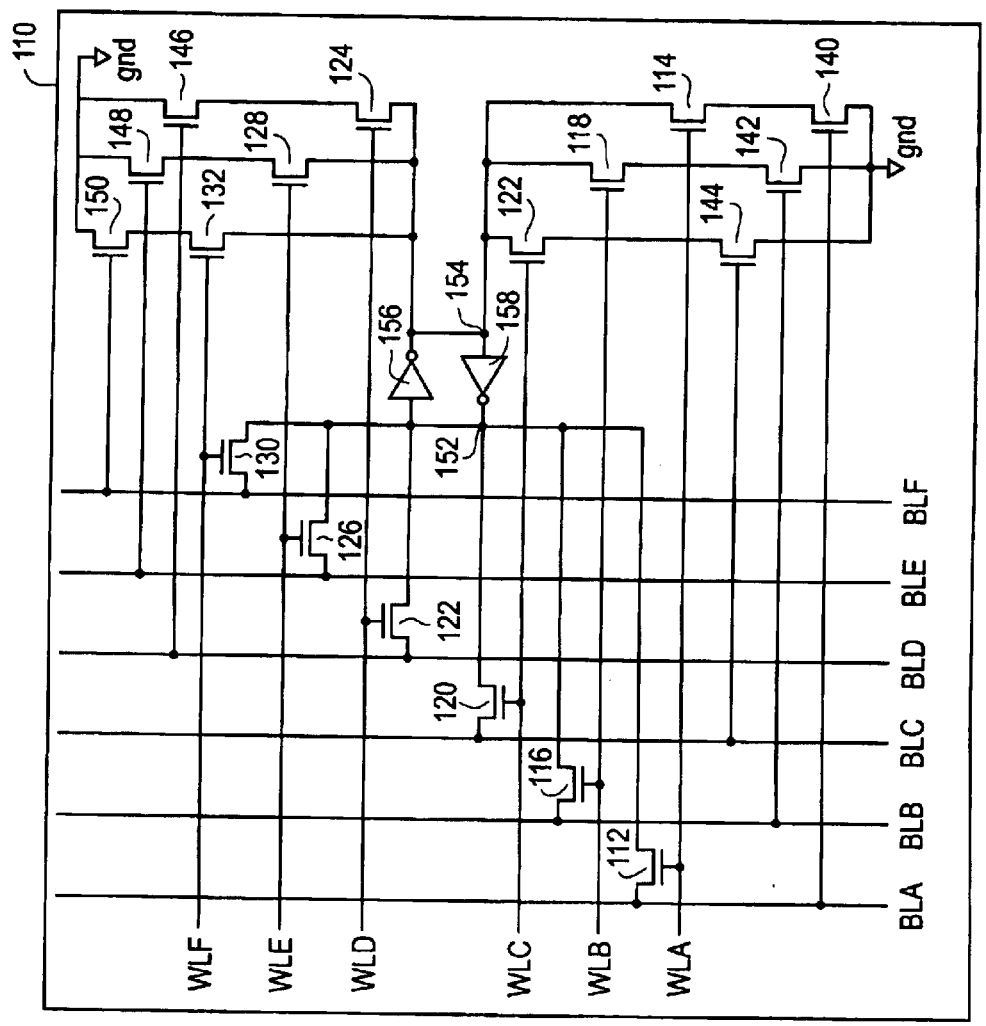
FIG. 1 is a schematic of an example of a prior art multi-write port memory cell.

The circuit of FIG. 1 may be viewed as a single six input multiplexer (bit lines BLA to BLF) with six selector lines (word lines WLA to WLF), where a "multiplexer," as used herein, is a circuit for selecting one of a number of inputs and switching its information to the output or outputs. In FIG. 1, each word line selects the associated bit line, for example, word line WLA selects bit line BLA. In order to reduce the number of word lines one preferred embodiment of the present invention uses a plurality of smaller cascaded multiplexers with each word line now selecting one or more bit lines.

Figure 3:
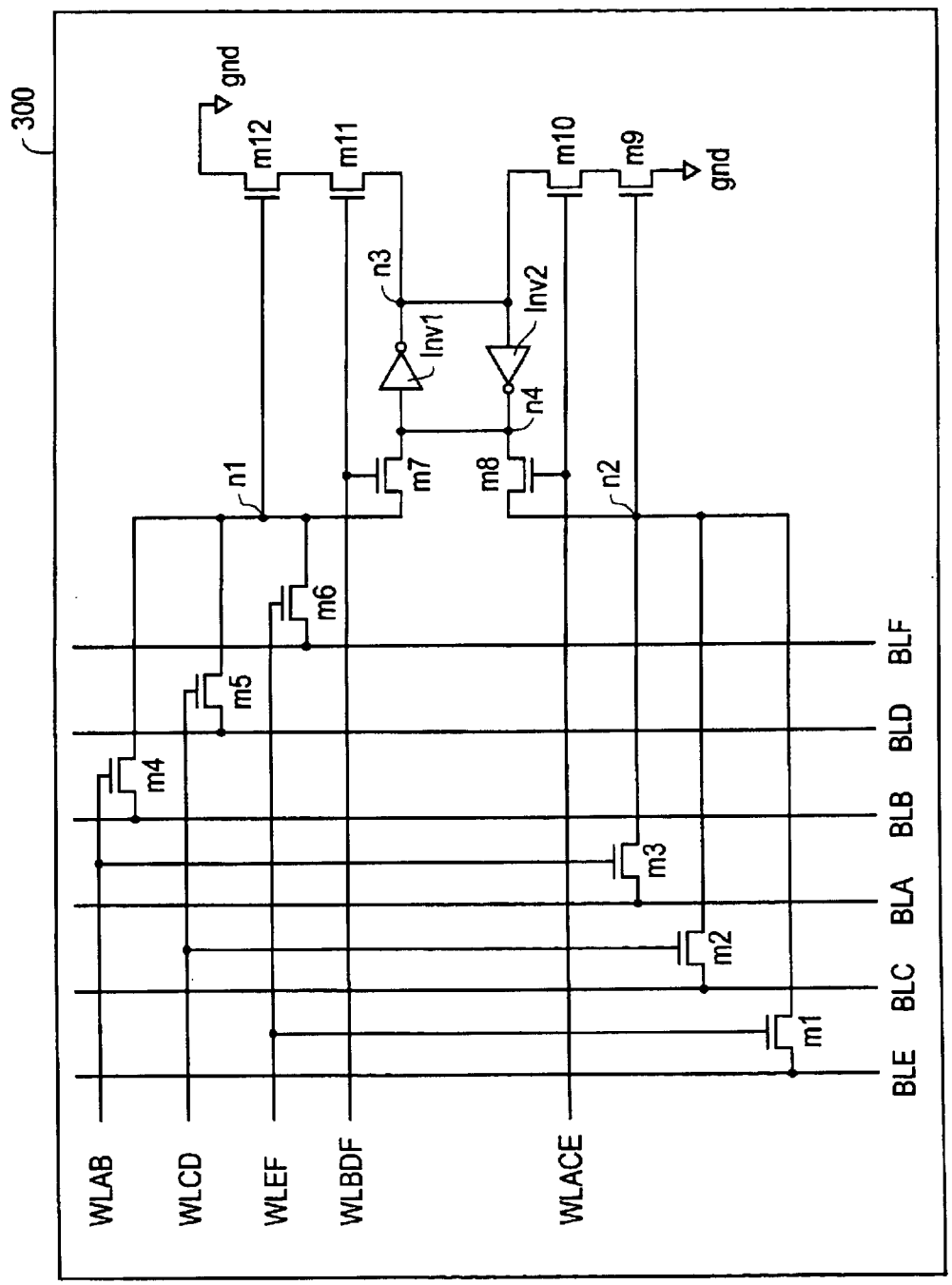
FIG. 3 is a schematic of a multi-write port memory cell of an embodiment of the present invention.

FIG. 3 is a schematic of a multi-write port memory cell of an embodiment of the present invention. Circuit 300 has five word lines, i.e., WLAB, WLCD, WLEF, WLBDF, and WLACE, and six bit lines, i.e., BLA, BLB, BLC, BLD, BLE, and BLF. The letters following "WL" in the word line labels were picked to indicate in the alternative which bit line may be selected, when the word line is asserted. For example, when word line WLAB is asserted, then either bit line BLA or BLB may be selected, or when word line WLBDF is asserted, then either bit line BLB, BLD, or BLF may be selected. Word line WLAB is connected to the gates of transistors m3 and m4. Word line WLCD is connected to the gates of transistors m2 and m5. Word line WLEF is connected to the gates of transistors m1 and m6. Word line WLBDF is connected to the gates of transistors m7 and m11. One conduction terminal of transistor m7 is connected to transistors m4, m5, and m6 via node n1. The other conduction terminal of transistor m7 is connected to node n4. Transistor m11 is connected to transistor m12 and to node n3. The gate of the transistor m12 is connected to transistors m4, m5 and m6 via node 1. Word line WLACE is connected to the gates of transistors m8 and m10. One conduction terminal of transistor m8 is connected to transistors m1, m2, and m3 via node n2. The other conduction terminal of transistor m8 is also connected to node n4. Transistor m10 is connected to transistor m9. The gate of transistor m9 is connected to transistors m1, m2, and m3 via node n2. Back-to-back inverters Inv1 and Inv2 form the one bit memory cell. The output of inverter Inv1 is connected to the input of inverter Inv2 via node n3. The output of inverter Inv2 is connected to the input of inverter Inv1 via node n4. Bit line BLE is connected to transistor m1. Bit line BLC is connected to transistor m2. Bit line BLA is connected to transistor m3. Bit line BLB is connected to transistor m4. Bit line BLD is connected to transistor m5. Bit line BLF is connected to transistor m6.

In FIG. 3 the word lines are asserted (i.e., set to '1') in pairs in order to select one of the bit lines: 1) word line WLBDF with word line WLAB, WLCD, or WLEF, or 2) word line WLACE with word line WLAB, WLCD, or WLEF. When word line WLAB is asserted, then transistors m3 and m4 are turned on selecting bit lines BLA and BLB, respectively. When word line WLCD is asserted, then transistors m2 and m5 are turned on selecting bit lines BLC and BLD, respectively. When word line WLEF is asserted, then transistors m1 and m6 are turned on selecting bit lines BLE and BLF, respectively. When word line WLBDF is asserted, transistors m7 and m11 are turned on, hence selecting bit line BLB, BLD, or BLF depending on which word line, i.e., WLAB, WLCD, or WLEF, respectively, is asserted. When word line WLACE is asserted, transistors m8 and m10 are turned on, hence selecting bit line BLA, BLC, or BLE depending on which word line, i.e., WLAB, WLCD, or WLEF, respectively, is asserted. The selected bit line then may set the value of the memory cell (e.g., node n4) to '0' or '1'.

When, for example, word lines WLEF and WLBDF are asserted, bit line BLF is selected. As WLBDF turns on transistors m7 and m11, the value on BFL sets node n4. If the value is '1', then m12 is turned on and node n3 is pulled to ground gnd. If the value is '0', then node n3 is changed by node n4 via inverter Inv1. When word line WLACE is asserted instead of WLBDF, then bit line BLE is selected instead of BLF. Then, the value on BLE sets node n4 similar to when BLF sets node n4 when WLBDF is asserted.

Figure 2:
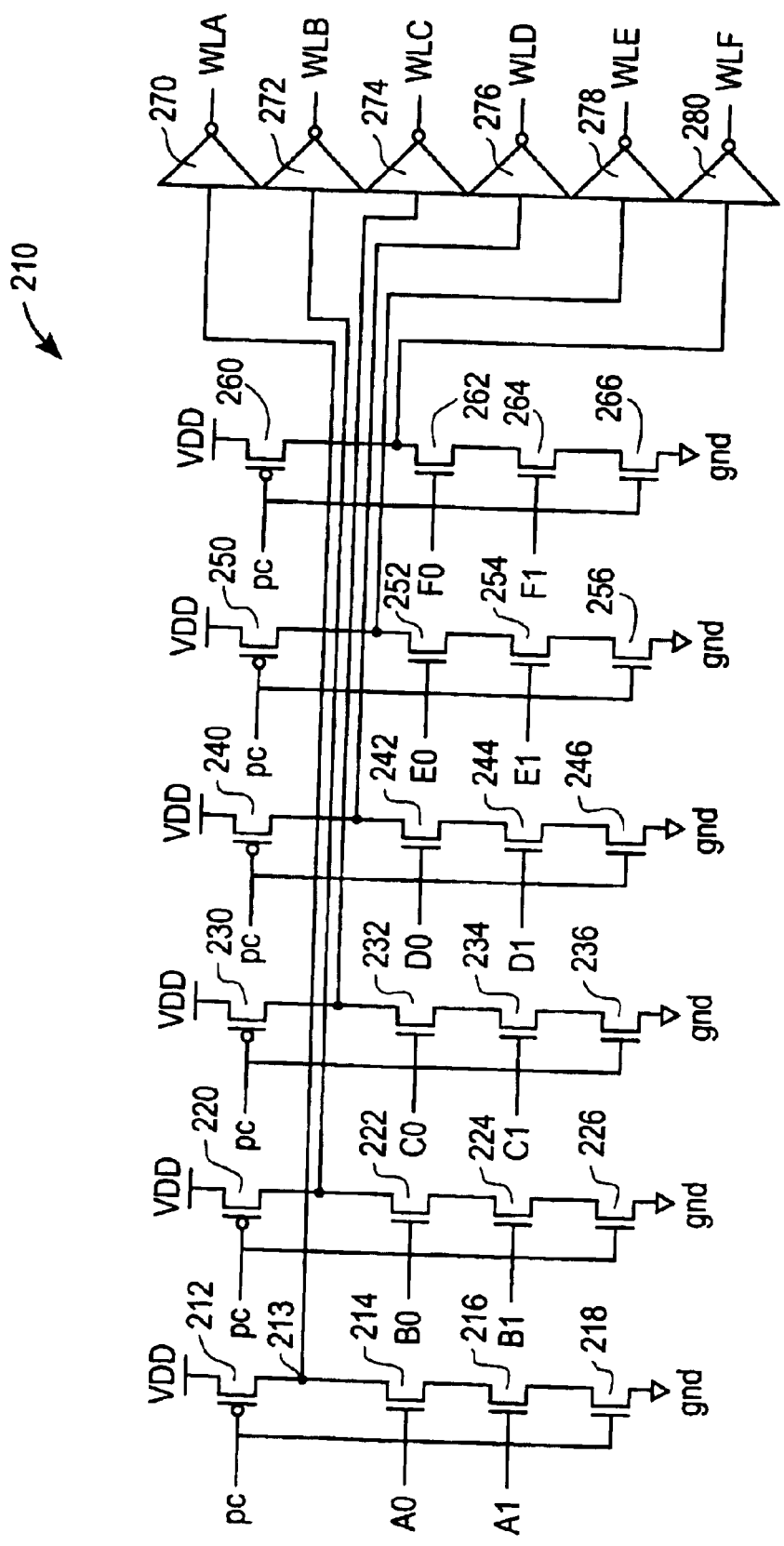
FIG. 2 shows a conventional final decoding circuit of the prior art, applicable to FIG. 1.
Figure 4:
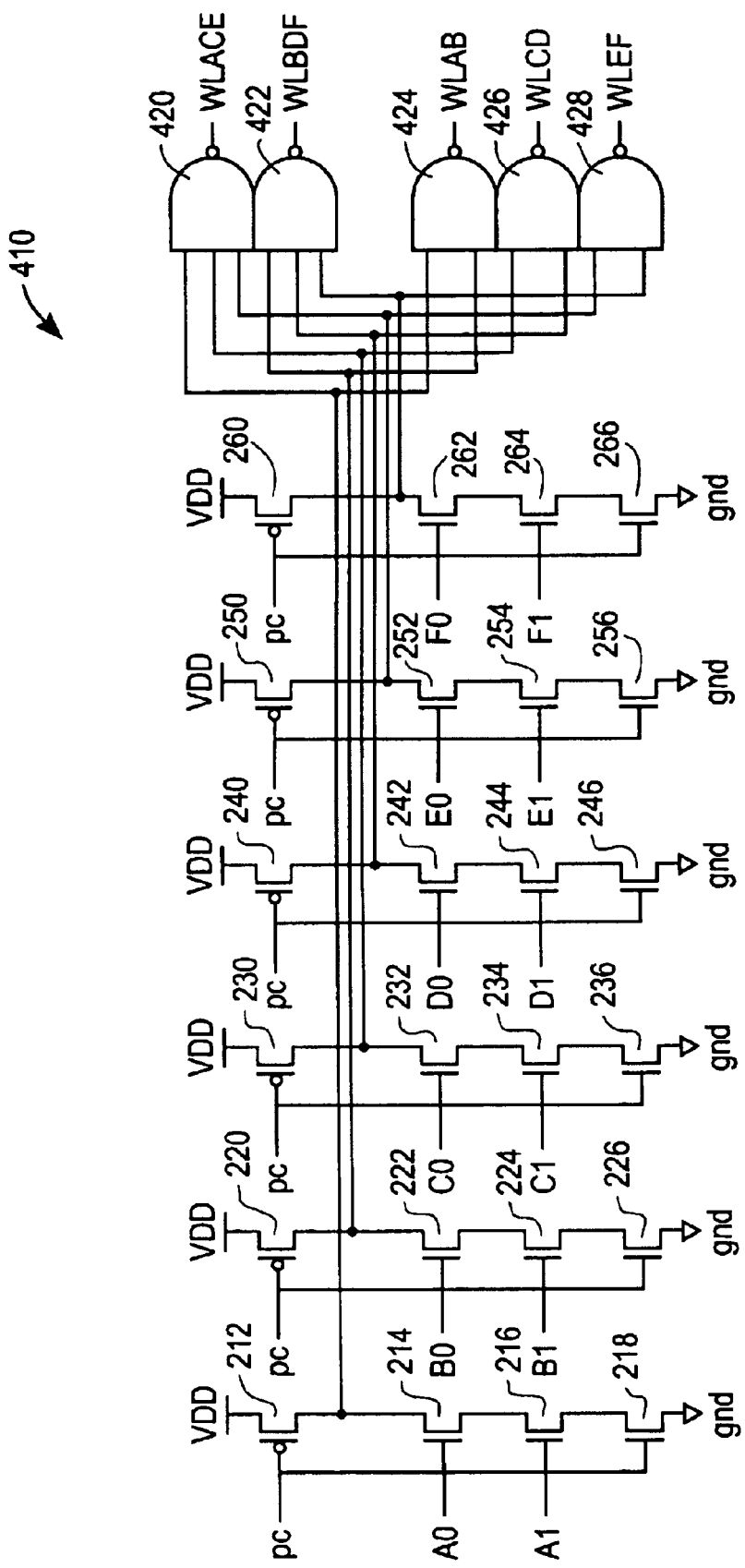
FIG. 4 is a schematic of a final decoding circuit corresponding to the memory cell circuit of FIG. 3.

FIG. 4 is a schematic of a final line decoding circuit 410 corresponding to the memory cell circuit 300 of FIG. 3 of an embodiment of the present invention. FIG. 4 is similar to final decode circuit of FIG. 2, except the inverters of FIG. 2 have been replaced by NAND gates in FIG. 4. As in FIG. 2 when address lines, e.g., A0 and A1 are '1', then the value on the corresponding bit line, in this case BLA in FIG. 3, is written to the memory cell. With A0 and A1 at '1' NAND gate 420 and NAND gate 424 asserts word line WLACE and WLAB, respectively. With B0 and B1 at '1' NAND gate 422 and NAND gate 424 asserts word line WLBDF and WLAB, respectively. With C0 and C1 at '1' NAND gate 420 and NAND gate 426 asserts word line WLACE and WLCD, respectively. With D0 and D1 at '1' NAND gate 422 and NAND gate 426 asserts word line WLBDF and WLCD, respectively. With E0 and E1 at '1' NAND gate 420 and NAND gate 428 asserts word line WLACE and WLEF, respectively. With F0 and F1 at '1' NAND gate 422 and NAND gate 428 asserts word line WLBDF and WLEF, respectively. Thus, for example, assertion of WLAB causes the write data on BLA to be written to node n2 through transistor m3 in FIG. 3. At the same time, the assertion of WLACE causes the data on node n2 to be written onto node n4 through transistor m8.

Figure 5:
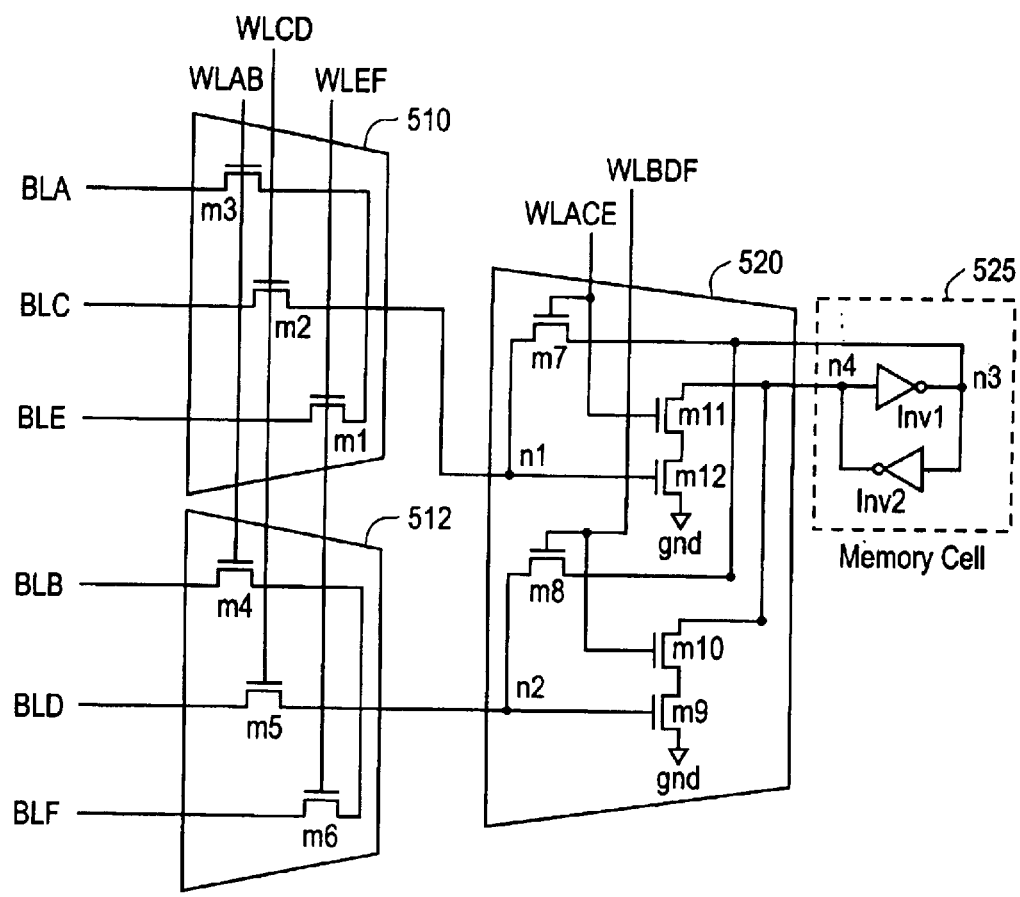
FIG. 5 is a re-arranged schematic of FIG. 3 showing an example of cascading multiplexers of an aspect of the present invention.

FIG. 5 is a re-arranged schematic of FIG. 3 showing an example of cascading multiplexers of an aspect of the present invention. The circuits of FIG. 3 and FIG. 5 operate in the same way. The multiplexers are in two stages. The first stage has multiplexers 510 and 512. Multiplexer 510 includes transistors m1, m2, and m3 which act as switches. There are three input data lines to multiplexer 510, bit lines BLA, BLC, and BLE with selector lines WLAB, WLAC, and WLEF, respectively. The output of multiplexer 510 is node n1. Multiplexer 512 includes transistors m4, m5, and m6 which act as switches. There are three input data lines to multiplexer 512, bit lines BLB, BLD, and BLF with selector lines WLAB, WLAC, and WLEF, respectively. The output of multiplexer 512 is node n2. Multiplexer 520 has two inputs at nodes n1 and n2 from multiplexers 510 and 512, respectively. The selector lines for multiplexer 520 are WLACE and WLBDF. WLACE is used to select multiplexer 510 and WLBDF is used to select multiplexer 512. There is a differential output of multiplexer 520 with the output at node n3 and the inverted output at node n4. When WLACE is '1', then node n3 is set equal to the value at node n1, as transistor m7 is turned on. When WLBDF is '1', then node n3 is set equal to the value at node n2, as transistor m8 is turned on. The memory cell 525 includes back-to-back inverters Inv1 and Inv2.

Figure 6:
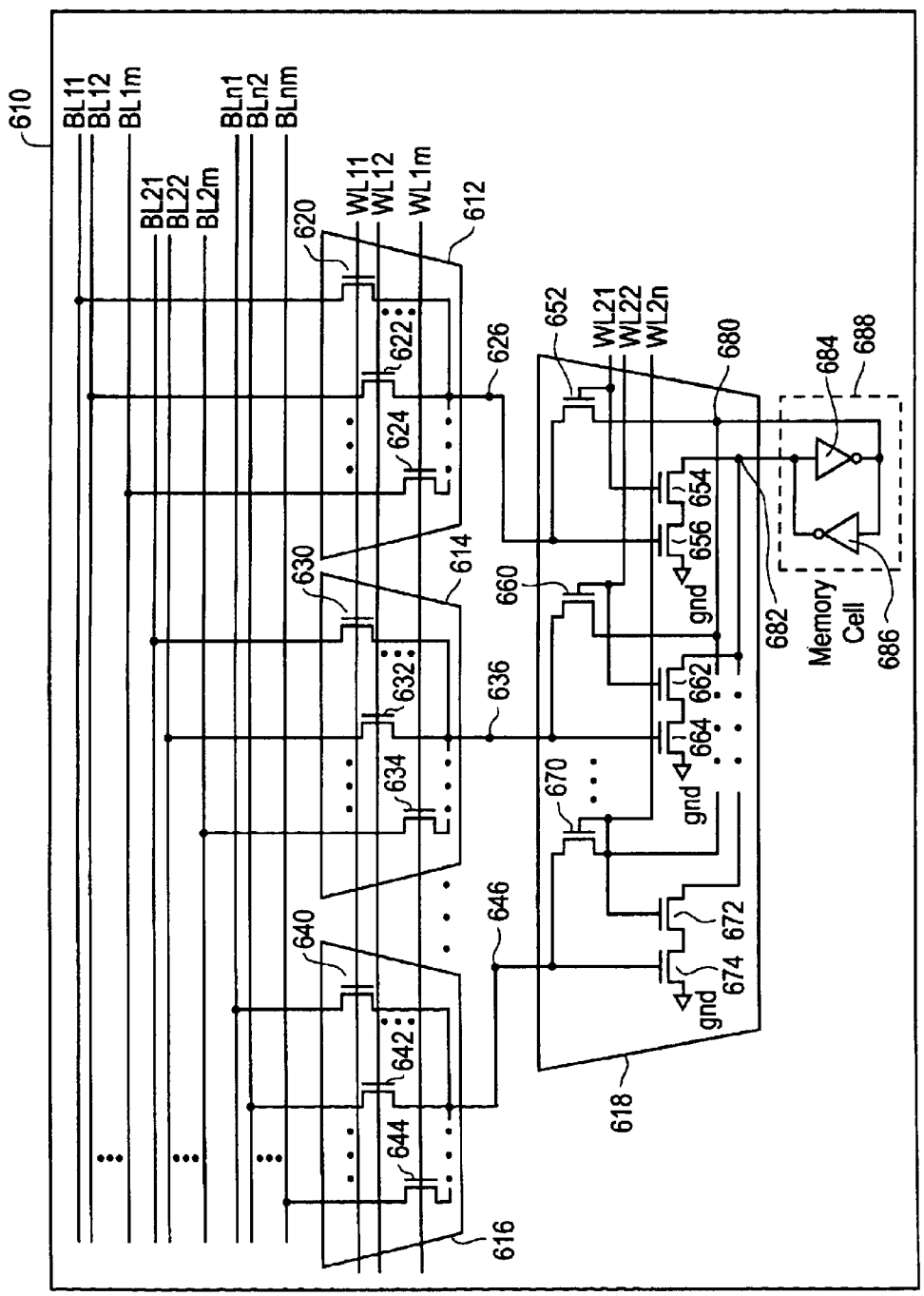
FIG. 6 is a schematic of a generalized memory cell circuit for n*m write ports (i.e., write bit lines) of another embodiment of the present invention.

FIG. 6 is a schematic of a generalized memory cell circuit for n*m write ports (i.e., write bit lines) of another embodiment of the present invention, where the variables "n" and "m" are positive numbers. Preferably, n>1 and m>2. As shown in FIG. 6, the memory cell circuit 610 comprises n instances of m-to-1 NMOS pass-gate multiplexers 612, 614, to 616, followed by a single n-to-1 multiplexer 618, followed by a back-to-back inverter pair, i.e., memory cell 688, that stores the data. The bit lines (i.e., write ports) are labeled BL11 to BLnm. The bit lines can be viewed as n groups with m bit lines, e.g., BL11, BL12, . . . , BL1m, in each group. The word lines are labeled WL11 to WL1m and WL21 to WL2n, where word lines WL11 to WL1m are the selector lines for multiplexers 612, 614 to 616 and word lines WL21 to WL2m are the selector lines for multiplexer 618.

The selector lines to the first stage of multiplexers 612, 614 to 616, are set up so that, when a word line is asserted, one bit line per multiplexer is selected. For example, when word line WL11 is selected, transistors 620, 630, to 640 are turned on and bit lines BL11, BL21, to BLn1 are selected to go to multiplexer outputs 626, 636, to 646, respectively. When word line WL12 is selected, transistors 622, 632, and 642 are turned on and bit lines BL12, BL22, to BLn2 are selected to go to multiplexer outputs 626, 636, to 646, respectively. And so on, until when word line WL1m is selected, transistors 624, 634, to 644 are turned on and bit lines BL1m, BL2m, to BLnm are selected to go to multiplexer outputs 626, 636, to 646, respectively.

The selector lines to the second stage multiplexer 618 select which output from the first stage multiplexers 612, 614 to 616 is sent to node 680, i.e., one input into the memory cell of back-to-back inverters 684 and 686. When word line WL21 is asserted, multiplexer 612 is selected and its output 626 is sent to node 680. When word line WL22 is asserted, multiplexer 614 is selected and its output 636 is sent to node 680. And so on until, when word line WL2n is asserted, multiplexer 616 is selected and its output 646 is sent to node 680. Similar to the operation of FIG. 3, when, for example, WL21 is asserted and output 626 is '1', transistors 654 and 656 are turned on and node 682 is pulled to ground at the same time node 680 is pulled to '1' (as transistor 652 is also turned on).

In an alternative embodiment of circuit 610 of FIG. 6 the transistors 654, 656, 662, 664, to transistors 672, and 674 are not present. Transistors 654 and 656 are used to pull node 682 to '0' when transistor 652 is pulling node 680 to '1'. Transistors 662 and 664 are used to pull node 682 to '0' when transistor 660 is pulling node 680 to '1'. Transistors 672 and 674 are used to pull node 682 to '0' when transistor 670 is pulling node 680 to '1'. Without transistors 654, 656, 662, 664, 672, and 674, multiplexer 618 looks similar to the structure of the first stage multiplexers, e.g., multiplexer 612.

FIG. 5 is a special case of FIG. 6 with n=2 and m=3. The bit lines are mapped: BL11=BLA, BL12=BLC, BL13=BLE, BL21=BLB, BL22=BLD, and BL23=BLF. The word lines are mapped: WL11=WLAB, WL12=WLCD, WL13=WLEF, WL21=WLACE, and WL22=WLBDF. Thus FIG. 5 is a subset of FIG. 6.

Figure 7:
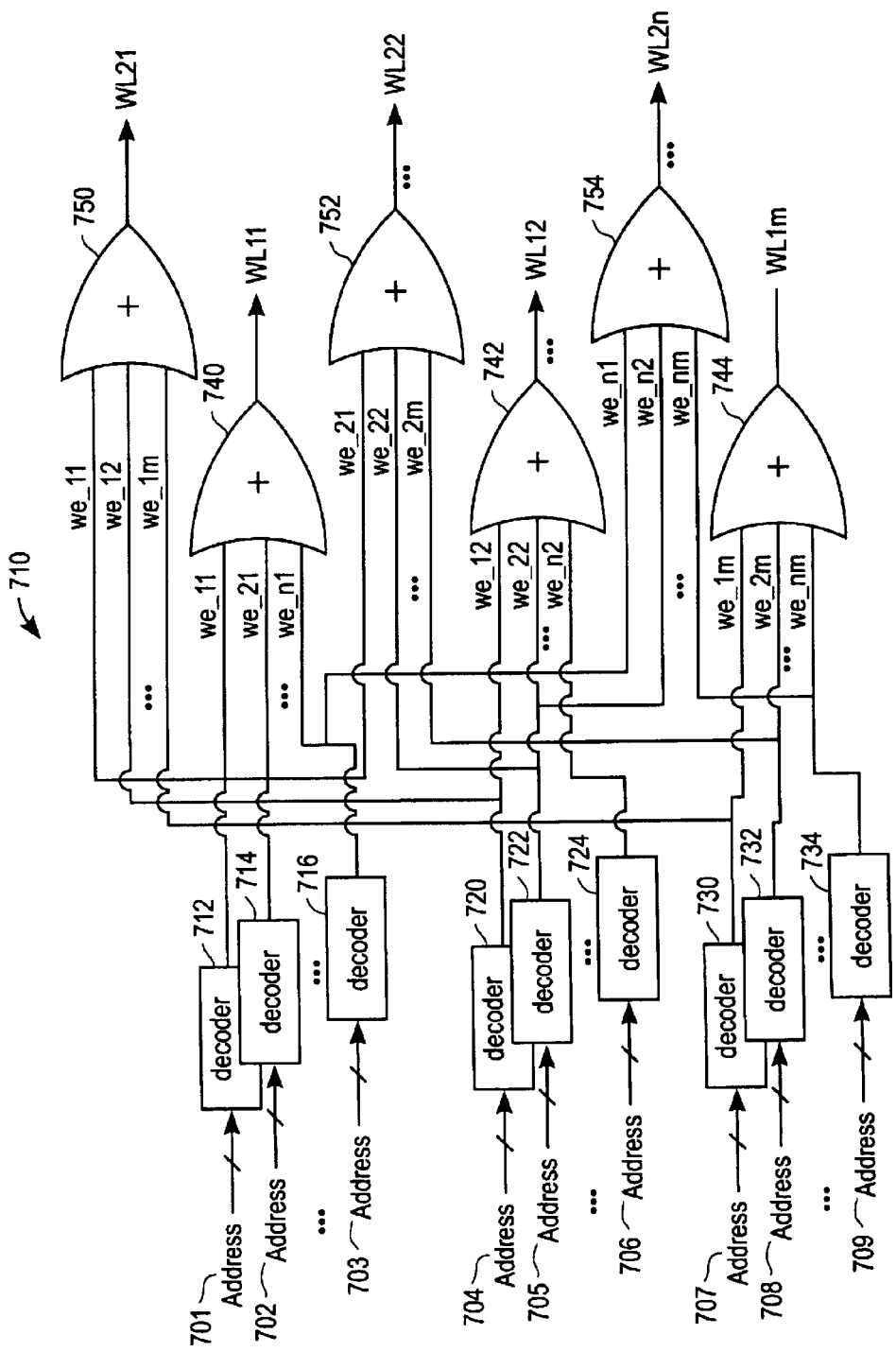
FIG. 7 is a schematic of a generalized circuit for providing the word line signals for the circuit of FIG. 6 of another embodiment of the present invention.

FIG. 7 is a schematic of a generalized circuit for providing the word line signals for circuit 610 of FIG. 6 of another embodiment of the present invention. The Addresses 701, 702, 703, 704, 705, 706, 707, 708, and 709 are sent by, for example, a processor, to select one or more of the bit lines BL11, BL21, BLn1, BL12, BL22, BLn2 , BL1m, BL2m, and BLnm, respectively, of FIG. 6. Each address label has one or more address signal lines connecting it to a decoder. The bit line addresses 701, 702, to 703 are connected to decoders 712, 714, to 716, respectively, which decode the address signals to give write enable signals we__11, we__21, to we__n1, respectively. These write enable signals are then combined using an OR gate 740 to give word line signal WL11, that is used as a select signal for multiplexers 612, 614, to 616 of FIG. 6. The bit line addresses 704, 705, to 706 are connected to decoders 720, 722, to 724, respectively, which decode the address signals to give write enable signals we__12, we__22, to we__n2, respectively. These write enable signals are then combined using an OR gate 742 to give word line signal WL12, that is used as another select signal for multiplexers 612, 614, to 616 of FIG. 6. The bit line addresses 707, 708 to 709 are connected to decoders 730, 732, to 734, respectively, which decode the address signals to give write enable signals we__1m, we__2m, to we__nm, respectively. These write enable signals are then combined using an OR gate 744 to give word line signal WL1m, that is used as yet another select signal for multiplexers 612, 614, to 616 of FIG. 6.

The word line select signals used for the first stage of multiplexers in FIG. 6, i.e., multiplexers 612, 614, to 616, can also be expressed by the following Boolean equations:

$$WL11=we\_11+we\_21+ \ldots +we\_n1$$

$$WL12=we\_12+we\_22+ \ldots +we\_n2$$

. . .

$$WL1m=we\_1m+we\_2m+ \ldots +we\_nm$$

where '+' denotes the logical OR operator, and we_ij is the write enable (decoded address) for bit line BLij. The write enable signal we_ij has value '1', when the address for bit line BLij indicates that the bit line has been selected. While, normally for this memory cell, only one bit line is selected to supply the data to be written to this memory cell, one or more of the other memory cells also may have data written to them simultaneously. This allows another memory cell with the same bit lines to be written to from another bit line at the same time this memory cell is being written to. Thus performance is increased compared with writing to the two memory cells serially.

The above write enable signals are combined together differently to produce the word lines used as select lines for the second stage multiplexer 618 of FIG. 6. Write enable signals we_11, we_12 to we_1m are input into OR gate 750 to produce word line WL21. Write enable signals we_21, we_22 to we_2m are input into OR gate 752 to produce word line WL22. Write enable signals we_n1, we_n2 to we_nm are input into OR gate 754 to produce word line WL2m.

The word line select signals used for the second stage of multiplexers in FIG. 6, i.e., mux2, can also be expressed by the following Boolean equations:

$$W21=wen\_11+wen\_12+ \ldots +wen\_1m$$

$$W22=wen\_21+wen\_22+ \ldots +wen\_2m$$

. . .

$$W2n=wen\_n1+wen\_n2+ \ldots +wen\_nm$$

Figure 8:
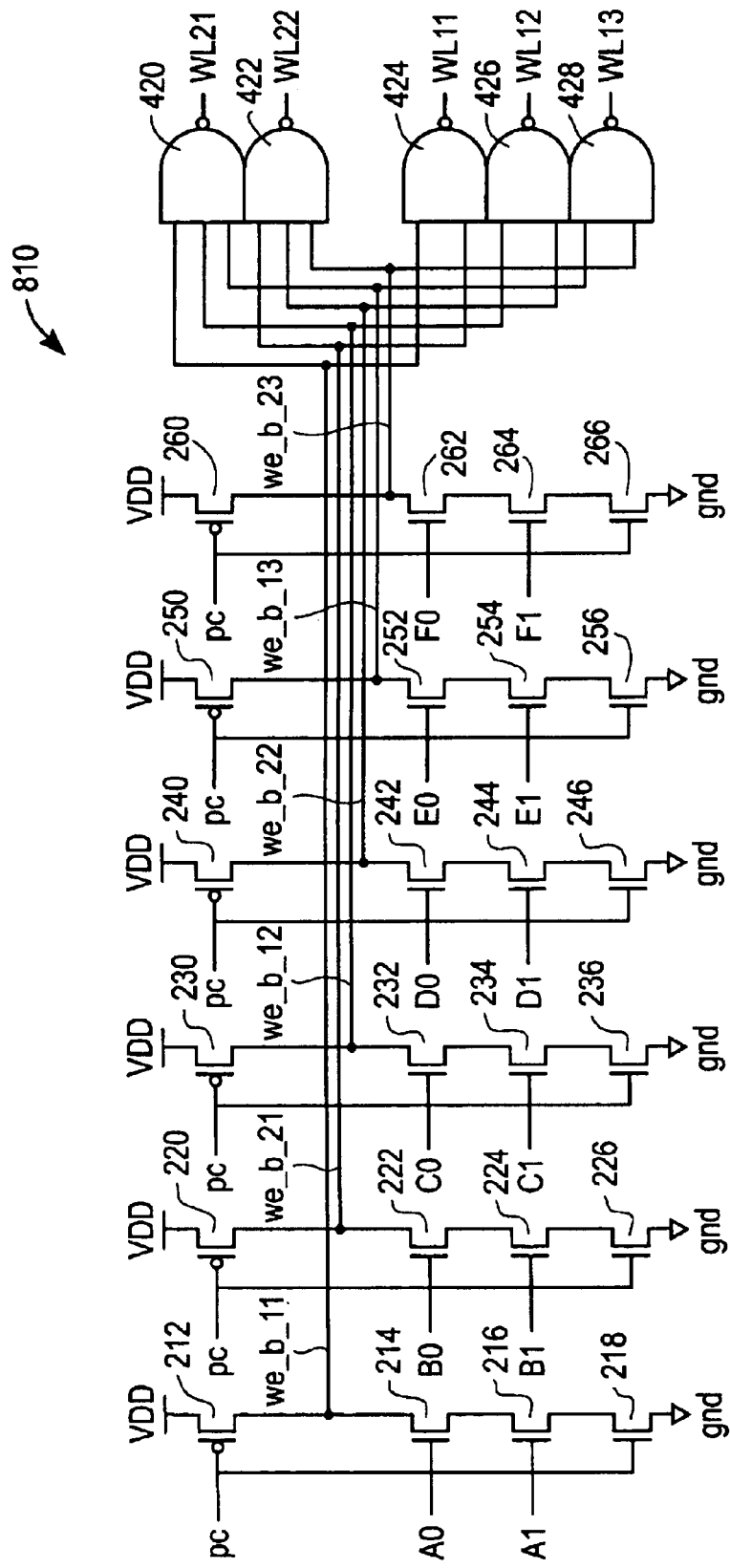
FIG. 8 is FIG. 4 with the word lines re-labeled to correspond to FIG. 6 with n=2 and m=3.

FIG. 8 is FIG. 4 with the word lines re-labeled to correspond to FIG. 6 with n=2 and m=3. Labels for inverse write enable lines ("we_b" for write enable bar) have been added, i.e., we_b_11, we_b_21, we_b_12, we_b_22, we_b_13, and we_b_23 for address line pairs, (A0, A1), (B0, B1), (C0, C1), (D0, D1), (E0, E1), and (F0, F1), respectively. The write enable bar signal is '0' when an address selects a bit line. The address line pairs correspond to bit lines BLA to BLF. When A0 and A1 are both '1' and pc=1, then we_b_11='0'. When B0 and B1 are both '1' and pc=1, then we_b_21='0'; and so forth for (C0, C1),(D0, D1), (E0, E1), and (F0, F1).

From the Boolean logic equivalence of NOT(NOT(X) AND NOT(Y))=X OR Y, the circuit 810 of FIG. 8 can be modified to be a subset of the circuit 710 of FIG. 7 with n=2 and m=3. Each precharge circuit of FIG. 8, e.g., precharge circuit having transistors 212, 214, 216, 218, has a write enable bar output, i.e., we_b_11, and thus has an inverted output being input into the appropriate NAND gates, e.g., 420 and 424. Adding an inverter (not shown) to the output of each precharge circuit and applying the above Boolean logic equivalence, the NAND gates, i.e., 420, 422, 424, 426, and 428, may be replaced by OR gates. Thus each decoder in FIG. 7 can be implemented in one embodiment of the present invention by a precharge circuit, e.g., a precharge circuit having transistors 212, 214, 216, 218, with its write enable bar output, i.e., we_b_11, connected to a converter, to produce, e.g., we_11 and the NAND gates, e.g., 420, replaced by OR gates. In other embodiments, the decoder may either fully or partially decode the bit line address and need not be the final decode stage. In addition, in other embodiments the OR gates are replaced by any logically equivalent gates in order to produce the select signals for the multiplexers of FIG. 6.

Table 1 shows how embodiments of this invention reduce the number of write word lines and transistors for various numbers of bit lines compared to FIG. 1. The number of word lines required in the prior art is equal to the number of bit lines. From FIG. 1, the prior art has three transistors per bit line.

TABLE 1

| Number of bit lines | n | m | No. Word lines | No. of transistors | Word lines saved | Transistors saved |
|---|---|---|---|---|---|---|
| 6 | 2 | 3 | 5 | 12 | 1 | 6 |
| 8 | 2 | 4 | 6 | 14 | 2 | 10 |
| 9 | 3 | 3 | 6 | 18 | 3 | 9 |
| 10 | 2 | 5 | 7 | 20 | 3 | 10 |
| 12 | 3 | 4 | 7 | 24 | 5 | 12 |

As can be seen from Table 1 above, the number of word lines in an embodiment of the present invention (n+m), while in the prior art the number of word lines is (n*m). The general trend is that as the number of bit lines increases, the number of word lines saved and the number of transistors saved increases. In any case there is a savings when the number of write ports increases.

Some of the advantages of embodiments of the invention compared to the prior art include: both fewer transistors and fewer word lines passing through the memory cell; a smaller bit line capacitance (e.g., one NMOS drain per bit line in FIG. 3 compared to one NMOS drain and one NMOS gate in FIG. 1); and fewer word lines to drive. Thus there is a smaller area and lower power consumption for the memory cell circuit of embodiments of the present invention.

The specification and drawings are provided for illustrative purposes. It will be evident that additions, subtractions, deletions, and other modifications and changes may be made there unto without departing from the broader spirit and scope of the invention as set forth in the claims.

What is claimed is:

1. A method for storing data in a memory cell circuit comprising a first plurality of bit lines and a plurality of word lines associated with each bit line, said method comprising:

using only one first word line of said plurality of word lines, selecting a second plurality of bit lines from said first plurality of bit lines;

using only one second word line of said plurality of word lines, selecting a bit line of said second plurality of bit lines; and storing a bit value on said bit line in said memory cell circuit.

2. The method of claim 1 wherein the second plurality of bit lines is less than said first plurality of bit lines.

3. The method of claim 1 wherein said memory cell circuit further comprises back-to back inverters.

4. The method of claim 1 wherein said second plurality of bit lines comprises bit lines from different multiplexers.

5. A reduced area memory cell circuit comprising:

a plurality of word lines associated with each bit line of a first plurality of bit lines;

a first word line of said plurality of word lines for selecting a second plurality of bit lines from said first plurality of bit lines, wherein only said first word line is used for selecting said second plurality of bit lines;

a second word line of said plurality of word lines for selecting a bit line of said second plurality of bit lines, wherein only said second word line is used for selecting said bit line; and a memory cell for storing a bit value on said bit line.

6. A memory cell circuit comprising:

a memory cell for storing data;

a first word line and a second word line;

a plurality of bit lines;

a first switch controlled by said first word line, said first switch connecting a first bit line of said plurality of bit lines to a first node; and a second switch controlled by said second word line, said second switch connecting said first node to said memory cell.

7. The memory cell circuit of claim 6 wherein said memory cell comprises back-to-back inverters.

8. The memory cell circuit of claim 6 wherein said first switch comprises a CMOS transistor.

9. The memory cell circuit of claim 8 wherein said second switch comprises another CMOS transistor.

10. The memory cell circuit of claim 6 wherein said first word line is generated by a final decode circuit comprising:

a precharge circuit for final decoding of an address of said bit line; and a first NAND gate for generating a first signal on said first word line.

11. The memory cell circuit of claim 10 wherein said final decode circuit further comprises a second NAND gate for generating a second signal on said second word line.

12. A system for writing data to a memory cell comprising:

a first multiplexer for selecting a first bit line of a plurality of bit lines, when a first word line selects said first bit line;

a second multiplexer for selecting a second bit line of said plurality of bit lines, when said first word line selects said second bit line; and a third multiplexer for selecting between an output of said first multiplexer and an output of said second multiplexer based on a second word line, wherein an output of said third multiplexer writes data to said memory cell.

13. The system of claim 12 wherein said memory cell comprises a first inverter connected to a second inverter.

14. The system of claim 12 wherein said output of said first multiplexer is a signal on said first bit line.

15. The system of claim 14 wherein said output of said second multiplexer is a signal on said second bit line.

16. The system of claim 15 wherein said output of said third multiplexer is said signal on said second bit line, when said output of said second multiplexer is selected by said second word line.

17. A system for providing a plurality of selector signals to a first multiplexer and a second multiplexer, wherein said first multiplexer receives data from a bit line having a bit line address, and wherein said second multiplexer receives data from said first multiplexer and writes said data to a memory cell, said system comprising:

a first plurality of decoders for receiving a first plurality of bit line addresses and producing a first plurality of write enable signals;

at least one logic gate for combining said first plurality of write enable signals into a first selector signal of said plurality of selector signals, said first selector signal controlling said first multiplexer;

a second plurality of decoders for receiving a second plurality of bit line addresses and producing a second plurality of write enable signals; and at least one logic gate for combining a write enable signal of said first plurality of write enable signals and a write enable signal of said second plurality of write enable signals into a second selector signal of said plurality of selector signals, said second selector signal controlling said second multiplexer.

18. The method of claim 17 wherein said logic gate comprises an OR gate.

19. The method of claim 17 wherein said logic gate comprises a NAND gate.

20. The method of claim 17 wherein said decoder comprises a precharge signal.

21. A memory cell circuit comprising a first plurality of bit lines, comprising:

means for selecting a second plurality of bit lines from said first plurality of bit lines;

means for selecting a bit line of said second plurality of bit lines; and means for storing a bit value on said bit line.

* * * * *